(12) United States Patent
Hyun

(10) Patent No.: US 7,422,959 B2
(45) Date of Patent: Sep. 9, 2008

(54) METHOD FOR FORMING ISOLATION TRENCH IN A SEMICONDUCTOR SUBSTRATE

(75) Inventor: Woo Seok Hyun, Choongcheongbukdo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 296 days.

(21) Appl. No.: 11/319,228

(22) Filed: Dec. 28, 2005

(65) Prior Publication Data

US 2006/0141732 A1 Jun. 29, 2006

(30) Foreign Application Priority Data

Dec. 29, 2004 (KR) .................... 10-2004-0114843

(51) Int. Cl.
*H01L 21/76* (2006.01)

(52) U.S. Cl. ................ 438/424; 257/E21.546

(58) Field of Classification Search .......... 438/424; 257/E21.546
See application file for complete search history.

(56) References Cited

U.S. PATENT DOCUMENTS

| | | | | |
|---|---|---|---|---|
| 5,296,392 A | * | 3/1994 | Grula et al. ........... | 438/222 |
| 6,066,885 A | * | 5/2000 | Fulford et al. ........ | 257/508 |
| RE37,228 E | * | 6/2001 | Fuse et al. ............ | 438/524 |
| 2004/0043530 A1 | | 3/2004 | Jang et al. | |
| 2004/0142562 A1 | * | 7/2004 | Chen et al. ........... | 438/689 |

FOREIGN PATENT DOCUMENTS

| KR | 10-20020096136 A | 12/2002 |
|---|---|---|
| KR | 20040058776 A | 7/2004 |

* cited by examiner

*Primary Examiner*—Bradley K Smith
(74) *Attorney, Agent, or Firm*—McKenna Long & Aldridge LLP

(57) ABSTRACT

A method for forming an isolation region in a semiconductor device such as a photodiode forms depletion layers at boundary regions between N-type regions of the photodiode and an ion injection layer in which P-type impurity ions are injected. Depletion layers are also formed between the N-type regions of the photodiode and a substrate of P-type semiconductor. Thus, depletion layers minimize a leakage current and eliminate interface defects. Low temperature processes are applied to prevent the impurity ions in the substrate from diffusing undesirably, thereby maximizing the pinning effect of the semiconductor device. The method includes steps of forming a trench region in a substrate; forming an ion injection layer by injecting impurity ions into an inner sidewall of the trench region; and forming an isolation region for a semiconductor device by filling the trench region with an undoped silicate glass film interposing the ion injection layer.

9 Claims, 3 Drawing Sheets

METHOD FOR FORMING ISOLATION TRENCH IN A SEMICONDUCTOR SUBSTRATE

CROSS-REFERENCE TO RELATED APPLICATIONS

This application claims the benefit of Korean Patent Application No. 10-2004-0114843, filed on Dec. 29, 2004, which is hereby incorporated by reference for all purposes as if fully set forth herein.

BACKGROUND OF THE INVENTION

1. Field of the Invention

The present invention relates to a method for forming an isolation region in a semiconductor device, and more particularly, to a method for forming an isolation region in a semiconductor device, suitable to effect electrical isolation between adjacent photodiodes in an image sensor.

2. Discussion of the Related Art

A highly integrated semiconductor device, e.g., a CMOS image sensor, can be used to convert an optical signal into an electrical signal output using an array of active devices, e.g., photodiodes, for forming an optical image based on an incident light signal. Arrays arranged to be increasingly more dense result in increased device integration, that is, the number of pixel units on a single substrate or the number of photodiodes per pixel is increased. Thus, the distance between photodiodes is reduced. Shallow trench isolation (STI) technology is used to minimize the negative effects of such integration, such as, electrical interference experienced by adjacent photodiodes. FIGS. 1A-1C show a conventional method for forming an isolation region in a semiconductor device using STI technology.

Referring to FIG. 1A, a trench region T is formed by selectively etching a substrate 11, which undergoes thermal oxidation. As shown in FIG. 1B, the thermal oxidation results in the formation of a thermal oxide film 12 on an inner sidewall of the trench region T. Thereafter, a tetra-ethyl-ortho-silicate is deposited over the entire surface of the substrate 11 and is then substantially planarized to leave a tetra-ethyl-ortho-silicate film 13 before undergoing a high-temperature treatment to increase its density. The high-temperature treatment produces an isolation region as shown in FIG. 1C, in which a densified tetra-ethyl-ortho-silicate film 13' fills the trench region T. The photodiodes (not shown) of a unit pixel are formed between isolation regions of the substrate 11.

The above-mentioned high-temperature processes, however, reduce a pinning effect in the photodiodes, which are to be formed between isolation regions of the substrate 11. The pinning effect is reduced due to diffusion of impurity ions in the substrate. In addition, interface defects occurring at a junction of the substrate 11 and isolation region degrade the electrical characteristics of the photodiode by increasing leakage current.

SUMMARY OF THE INVENTION

Accordingly, the present invention is directed to a method for forming an isolation region in a semiconductor device that substantially obviates one or more of the problems due to limitations and disadvantages of the related art.

An advantage of the present invention is to provide a method for forming an isolation region in a semiconductor device which can maximize a pinning effect of a semiconductor device formed between isolation regions of a substrate.

Another advantage of the present invention is to provide a method for forming an isolation region in a semiconductor device which can minimize a leakage current caused by defects occurring at a junction of a substrate and isolation region.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, there is provided a method for forming an isolation region in a semiconductor device. The method comprises forming a trench region in a substrate; forming an ion injection layer by injecting impurity ions into an inner sidewall of the trench region; and forming an isolation region for a semiconductor device by filling the trench region with an undoped silicate glass film interposing the ion injection layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiment(s) of the present invention, examples of which are illustrated in the accompanying drawings. Wherever possible, like reference designations will be used throughout the drawings to refer to the same or similar parts.

Figure 2A:
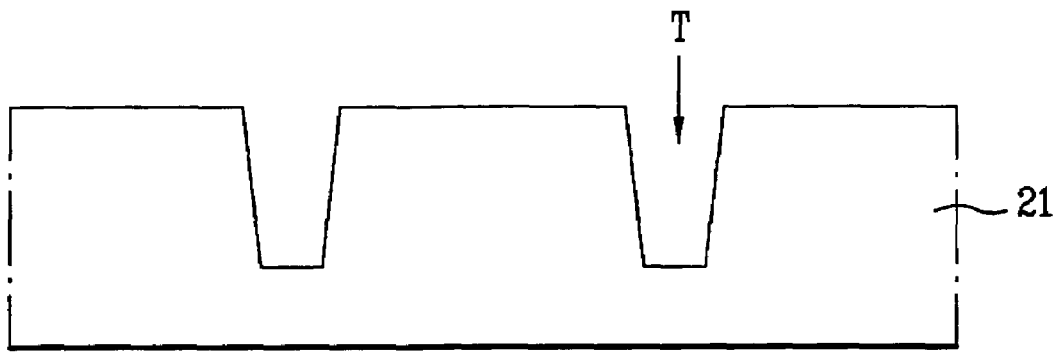
FIGS. 2A-2D are cross-sectional views illustrating a method for forming an isolation region in a semiconductor device according to the present invention.

Referring to FIG. 2A, a trench region T is formed by selectively etching a substrate 21 using reactive ion etching of the silicon of the substrate. In an exemplary embodiment of the method of the present invention, the substrate 21 may be a P-type semiconductor substrate.

Figure 2B:
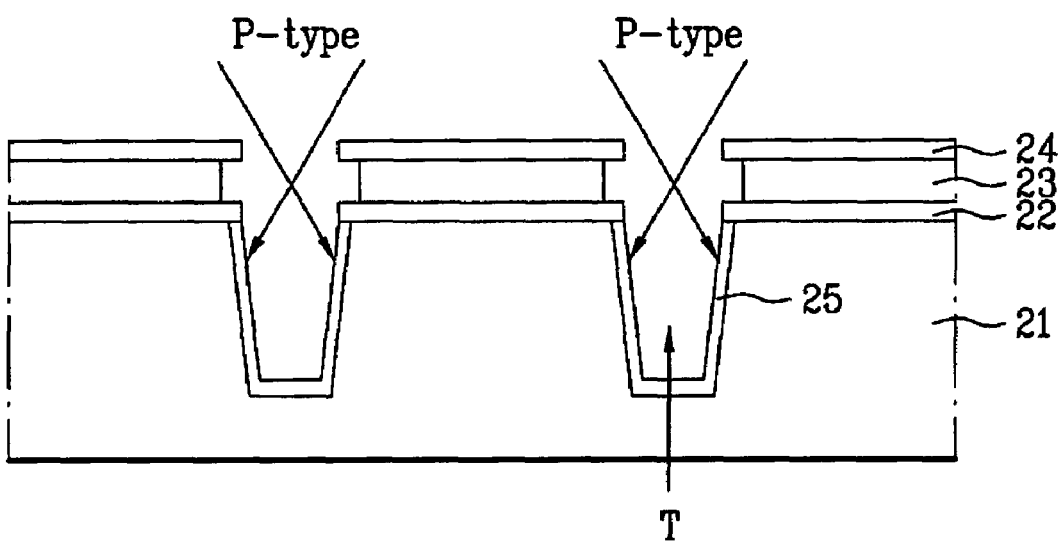

Referring to FIG. 2B, a buffer film 22, an insulating film 23, and a pad film 24 are formed on the substrate 21 in succession and each is subjected to selective etching until the inner surface of the trench region T is fully exposed. The buffer film 22 and the pad film 24 are etched to form an opening having a width equal to that of an upper point of the trench region T. The insulating film 23 is etched to form an opening having a greater width than the opening formed by the etching of the buffer film 22 and the pad film 24. Thus, after the insulating film 23 is etched, portions of the buffer film 22 and the pad film 24 extend inwardly, beyond the opening of the insulating film 23. The buffer film 22 and the pad film 24 may be formed of oxide and the insulating film 23 may be formed of nitride. Then, an ion injection layer 25 is formed on an exposed inner sidewall of the trench region T by injecting impurity ions into the trench at an oblique angle with respect to its inner sidewall. The exemplary embodiment of the present invention uses P-type impurities for the above ion injection, which may be performed at a tilt angle of 5~10°, and preferably, at a tilt angle 7°, with four rotations or 4[rot].

Figure 2C:
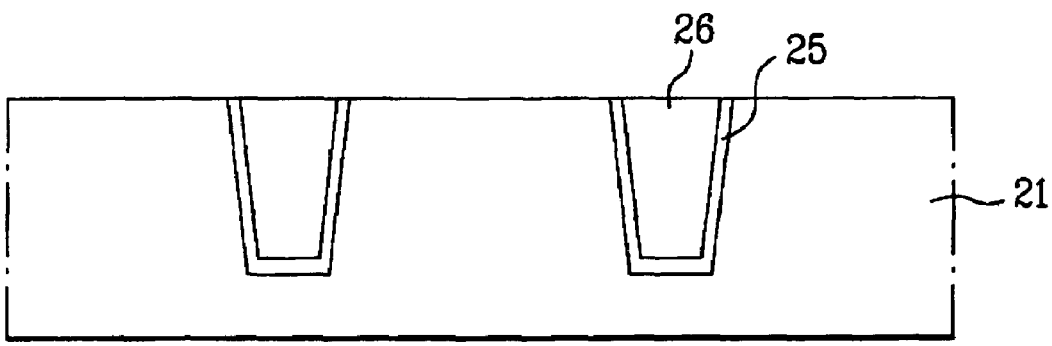

Referring to FIG. 2C, undoped silicate glass is deposited by a high-density plasma method over the entire surface of the substrate 21, thereby covering the ion injection layer 25. The deposited undoped silicate glass is then planarized by, for example, chemical-mechanically polishing. Thus, an isolation region is formed by an undoped silicate glass film 26 filling the trench region T.

Figure 2D:
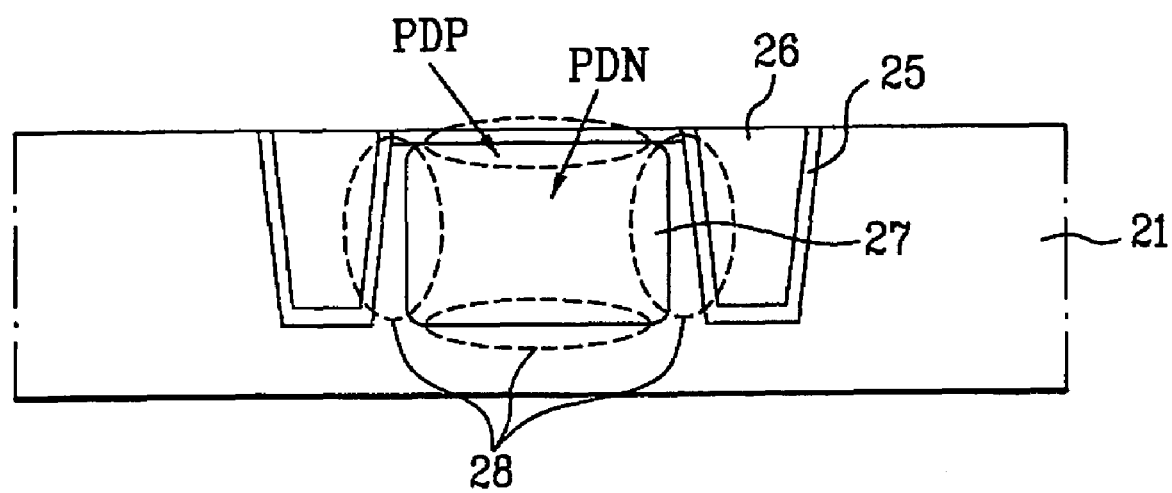

Referring to FIG. 2D, a photodiode 27 is formed between the isolation regions of the substrate 21. In the exemplary embodiment of the present invention, the photodiode 27 includes a P-type region (PDP) near the surface of the substrate 21 and an N-type region (PDN) under the P-type region. As a result of the juxtaposition of the different impurity types, depletion regions 28 are created between the N-type region and the ion injection layer 25, which includes the injected P-type impurities. Depletion regions 28 are also created between the N-type region and the P-type semiconductor substrate 21. Depletion regions 28 thereby minimize leakage current.

Figure 1A:
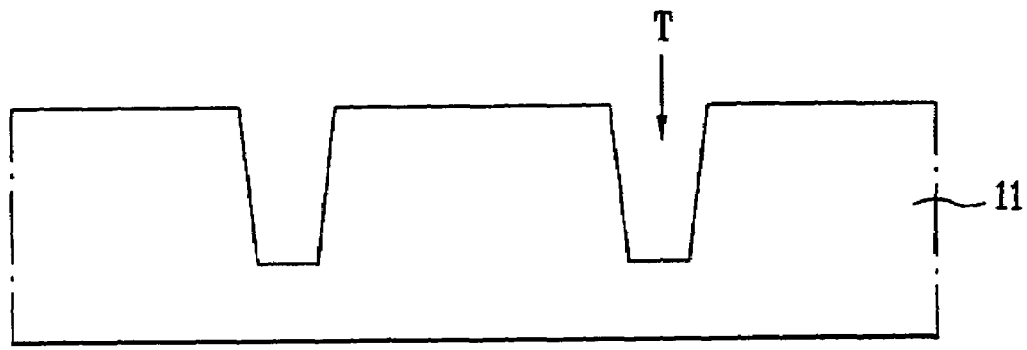
FIGS. 1A-1C are cross-sectional views illustrating a method for forming an isolation region in a semiconductor device according to the related art.
Figure 1B:
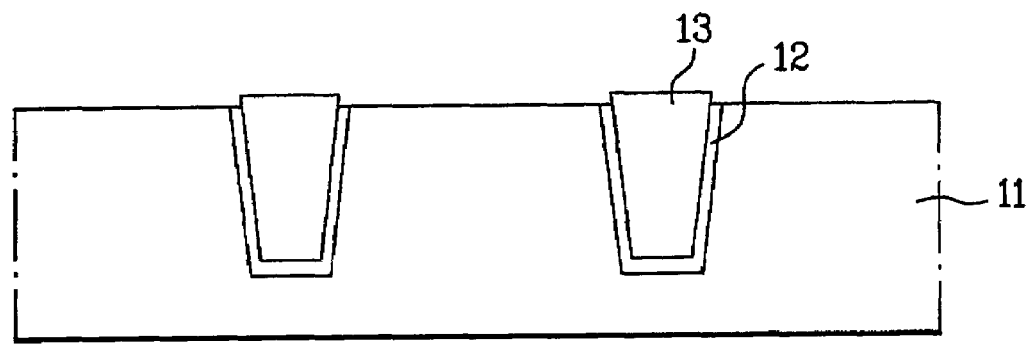
Figure 1C:
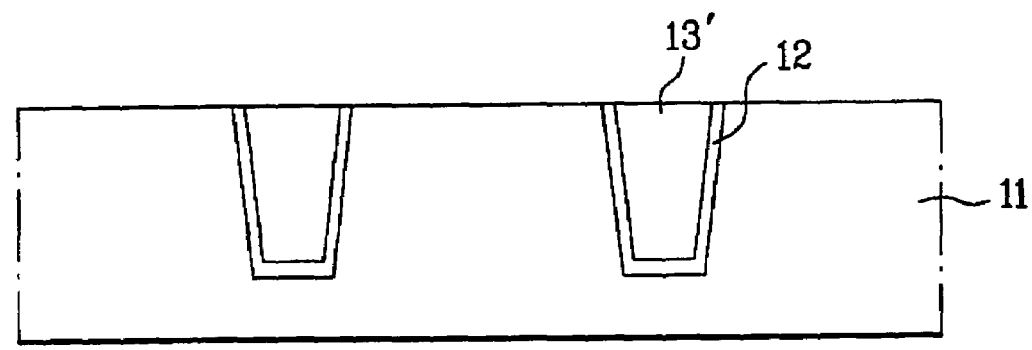

Meanwhile, the reactive ion etching for forming the trench region T generates specific surface characteristics and a lattice structure of a surface of the substrate 21. Such etching defects can be restored, as in the related art method, by the high temperature thermal oxidation applied in forming the thermal oxide film 12 (see FIG. 1B). This high-temperature process, however, can be avoided in the present invention, so that the ion injection layer 25, which forms depletion regions 28 at a boundary of the N-type region, can be formed only at the surface of the trench region T. That is, since the P-type impurity ions are injected obliquely in forming the ion injection layer 25, the surface characteristics and lattice structure of the substrate 21 prevent the injected P-type impurities from penetrating deeply into the substrate, i.e., beyond a surface level. Moreover, the reduced pinning effect problem of the photodiode 27, due to the diffusion of the impurity ions in the substrate 21 at the time of the high-temperature process for forming the tetra-ethyl-ortho-silicate film 13 (see FIG. 1C), can be eliminated by filling the trench region T with the undoped silicate glass film 26 using the high-density plasma method. This high-density plasma method is a low-temperature process. Thus, diffusion of impurity ions is prevented. Thus, the pinning level of the photodiode 27, i.e., the maximum channel potential that the photodiode can achieve, can be maximized. The pinning level of the photodiode 27 is fixed by the doping levels of the structure effect of the photodiode.

By adopting the method of the present invention, in which depletion layers are formed at boundary regions between the N-type regions of the photodiode and the P-type ion injection layer and between the N-type regions of the photodiode and the P-type semiconductor substrate, leakage current can be minimized by eliminating interface defects that may occur between the isolation region and the substrate. Thus, the electrical characteristics of a semiconductor device are enhanced. Moreover, an application of low-temperature processes prevents impurity ions in the substrate from diffusing undesirably, thus, maximizing the pinning effect of the semiconductor device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for forming an isolation region comprising:
   forming a trench region in a substrate;
   forming a buffer film, an insulating film and a pad film on the substrate;
   selectively etching until the inner surface of the trench region is exposed;
   forming an ion injection layer by injecting impurity ions into an inner sidewall of the trench region; and
   forming an isolation region for a semiconductor device by filling the trench region with an undoped silicate glass film interposing the ion injection layer, wherein selectively etching until the inner surface of the trench region is exposed includes:
   etching the buffer film and the pad film to form an opening having a width equal to that of an upper point of the trench region and etching the insulating film to form an opening having a greater width.

2. The method of claim 1, wherein the substrate is a P-type semiconductor substrate.

3. The method of claim 1, wherein the impurity ions are P-type impurity ions.

4. The method of claim 1, wherein the impurity ions are injected with four rotations.

5. The method of claim 1, wherein the impurity ions are injected obliquely with respect to a surface of the inner sidewall of the trench region.

6. The method of claim 5, wherein the impurity ions are injected at a tilt angle of 5~10°.

7. The method of claim 5, wherein the impurity ions are injected at a tilt angle of 7°.

8. The method of claim 5, wherein the impurity ions are injected with four rotations.

9. The method of claim 1, wherein the undoped silicate glass film is formed by a high density plasma method.

* * * * *